United States Patent [19]

Yoshio et al.

[11] Patent Number: 5,012,242
[45] Date of Patent: Apr. 30, 1991

[54] INPUT DATA PROCESSOR FOR D/A CONVERTER UTILIZING DITHERING

[75] Inventors: Junichi Yoshio; Masami Suzuki, both of Tokorozawa, Japan

[73] Assignee: Pioneer Electronic Corporation, Tokyo, Japan

[21] Appl. No.: 491,992

[22] Filed: Mar. 12, 1990

[30] Foreign Application Priority Data

Jul. 10, 1989 [JP] Japan .................................. 1-177624

[51] Int. Cl.⁵ ............................................. H03M 1/00
[52] U.S. Cl. ..................................... 341/131; 341/144
[58] Field of Search ............... 341/131, 126, 144, 139, 341/155

[56] References Cited

U.S. PATENT DOCUMENTS 4,857,927  8/1989  Takabayashi ........................ 341/131
4,937,576  6/1990  Yoshio et al. ....................... 341/131

*Primary Examiner*—A. D. Pellinen
*Assistant Examiner*—Brian K. Young
*Attorney, Agent, or Firm*—Sughrue, Mion, Zinn, Macpeak & Seas

[57] ABSTRACT

An input data processor of the present invention has a dither signal adder for adding a dither signal to digital data which corresponds to an alternating signal of the type which crosses the zero level each time the alternating signal varies from a maximum to a minimum (i.e., positive max to negative max). The resultant signal of the digital signal added to the dither signal is sent to a level shift circuit which shifts the digital data output from the adder to a positive or negative level, which has sufficient magnitude to prevent the signal from crossing the zero level during variation from max to min. By eliminating zero crossing with this shifting operation, the present invention prevents inversion of the MSB of the digital signal, which also prevents glitches in the analog output. These glitches were previously caused by inversion of the MSB.

5 Claims, 6 Drawing Sheets

INPUT DATA PROCESSOR FOR D/A CONVERTER UTILIZING DITHERING

BACKGROUND OF THE INVENTION

The present invention relates to an input data processor for a D/A (Digital to Analog) converter, and more particularly to an input data processor for a D/A converter which is suitable for an information reproducer for a record medium such as an optical disk or the like having digital signals as recorded information.

D/A converters are generally used in digital audio equipment such as CD (Compact Disk) players or the like for the purpose of converting the digital data recorded in CD players into analogue signals. D/A converters generate quantizing noise by switching operation. As such quantizing noise includes higher harmonics of higher order to cause waveform distortion thereby to hinder faithful reproduction. In order to prevent the generation of such quantizing noise, a dither signal is conventionally added to the digital data read from a CD player.

In CD players, data is expressed by using 2's complement data. In a case of 2's complement data, inversion of MSB (Most Significant Bit) is performed at each time digital data crosses the zero level during conversion by a D/A converter. During the MSB inversion, switching noise called glitch is generated.

Such glitch is noise naturally generated in the D/A converter, and the use of a dither circuit causes such glitch to be increased by vibration of the dither signal. This phenomenon is caused by an increase in the number of times of zero crossing in correspondence with the vibration of the dither signal. When the D/A conversion output containing such glitch is introduced into a low pass filter, the output signal is integrated in the low pass filter to produce a distorted waveform. Particularly, when the original signal is a low level of signal, this has a significant effect and causes a reduction in the fidelity of reproduction.

SUMMARY OF THE INVENTION

Accordingly, it is an object of the present invention to provide an input data processor for a D/A converter which is capable of preventing the generation of switching noise at the zero crossing point of a signal.

The present invention provides a device for processing digital data which is input to a D/A converter and correspond to an alternating current signal which crosses the zero level each time the signal changes direction, the device comprising a level shift circuit for shifting the alternating current signal expressed by digital data to a positive potential level or a negative potential level on the basis of the zero level.

The level shift circuit shifts the level of the alternating current signal expressed by the digital data to a positive potential level or a negative potential level on the basis of the zero level. Thus the input signal data does not cross the zero level. It is therefore possible to prevent the occurrence of switching noise in the D/A converter during the zero crossing.

BRIEF DESCRIPTION OF THE DRAWINGS

FIG. 9($b$) is an explanatory view of the affect of compressing a data length.

DESCRIPTION OF THE PREFERRED EMBODIMENTS

Outline of CD player

Figure 1:
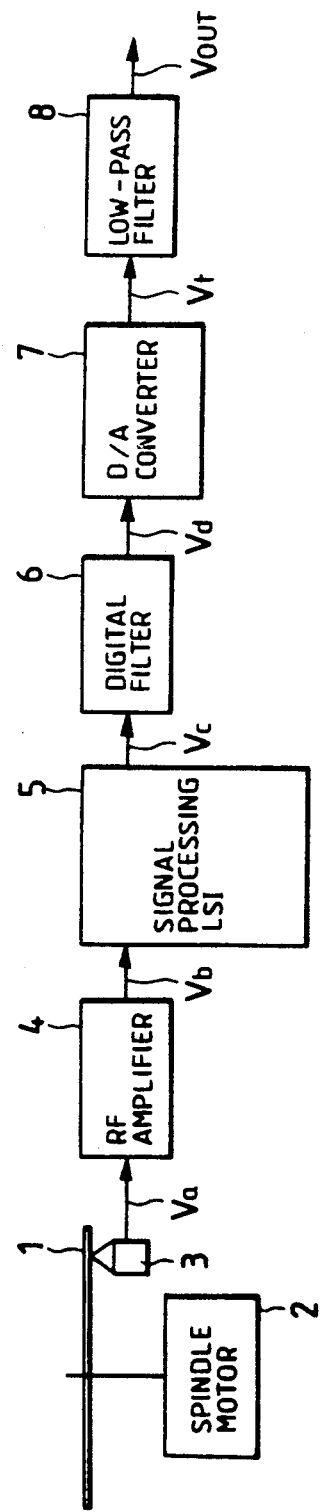
FIG. 1 is a schematic block diagram of a CD player to which the present invention is applied.

FIG. 1 schematically shows an example of CD players to which the present invention can be applied. FIG. 1 shows the audio signal reproducing system of the CD players.

A signal track, on which information is recorded, is formed on the recording surface of a CD 1 in such a manner that it is extended from the inner periphery of the CD 1 toward the outer periphery thereof in a spiral form. The signal track comprises a plurality of signal pits corresponding to recorded information. When the recorded information is read, a spindle motor is rotated at a predetermined rotational speed. A turn table (not shown) is provided on the rotational shaft of the spindle motor 2. The CD 1 is placed on the turn table and rotated. During rotation of the CD 1, an optical pickup 3 applies a laser beam to the signal track for the purpose of reading the information. The laser beam applied is reflected from the signal pits and again returned to the optical pickup 3 or not returned in accordance with the signal pits. The return of the reflected beam depends upon the irregularity of the signal pits. The reflected beam returned to the optical pickup 3 is converted into an electrical signal $V_a$ in the optical pickup 3. The electrical signal $V_a$ generated is called a RF (Radio Frequency) signal. As the higher harmonic component of the RF signal $V_a$ has an amplitude smaller than that of the lower harmonic component thereof, the signal $V_a$ is thus unsuitable for conversion into a binary signal. The RF signal $V_a$ is therefore subjected to waveform shaping in an RF amplifier 4 to be converted into a correct binary digital signal $V_b$. The thus-obtained digital signal $V_b$ is input to a signal processing LSI (Large Scale Integrated Circuit) 5 for processing the digital signal.

Figure 2:
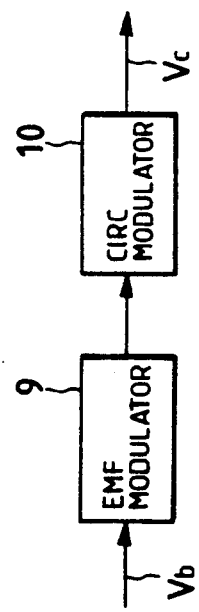
FIG. 2 is a block diagram which shows the arrangement of a signal processing LSI.

The digital signal processing in the signal processing LSI 5 includes various kinds of processing, but it mainly comprises the processing in EFM (Eight to Fourteen Modulation) modulator 9 and the signal error correcting circuit 10, which are both shown in FIG. 2. EFM modulation is effected for causing the laser beam to accurately track the signal pits and clearly discriminate between the presence and the absence of a pulse. The correction of signal error is effected by adding a signal related to a signal pulse, for example, CIRC (Cross Interleave Reed-Solomon Code). The digital signal $V_c$ resulted from the signal processing is sent to a digital filter 6.

For example, a non-cyclic digital filter (FIR: Finite Impulse Response Filter) having linear phase shifting properties is used as the digital filter 6. The digital signal $V_c$ output from the digital filter 6 is sent to a D/A converter 7.

A description will now be given of an example of a conventional D/A converting device with a dither circuit in order to support understanding.

Figure 3:
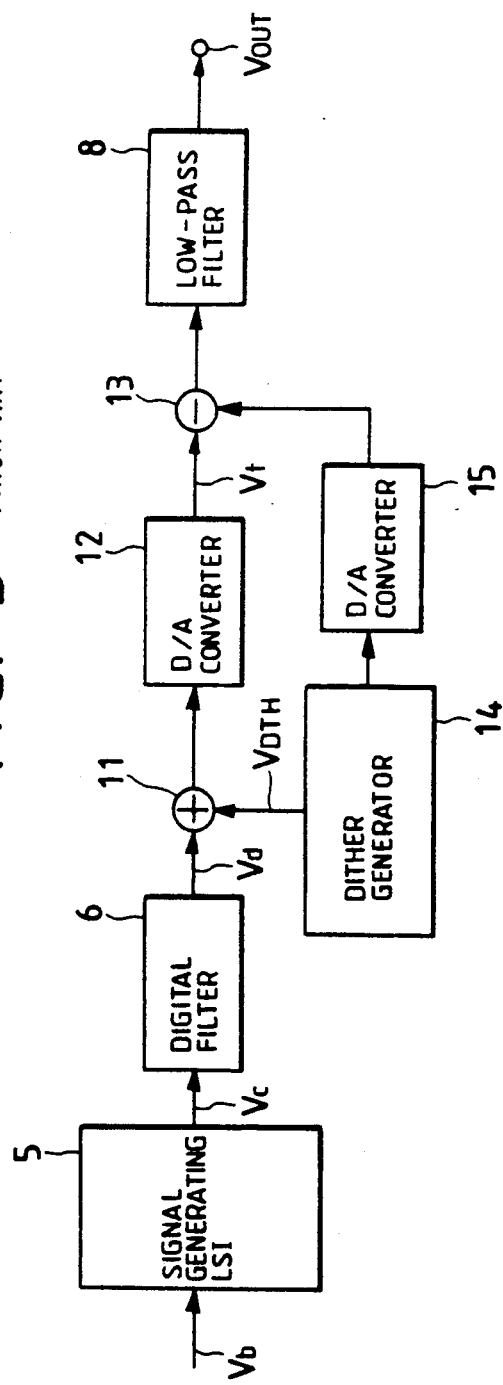
FIG. 3 is a block diagram which shows a conventional D/A converter.

As shown in FIG. 3, the digital data picked up from the CD 1 is sent through the digital signal processing LSI 5 to the digital filter 6, in which the sampling rate is converted into N times of $F_s$ (sampling frequency), and then converted into an analogue signal by a D/A converter 12.

An adder 11 is interposed between the digital filter 6 and the D/A converter 12 so as to add a random M-sequence dither signal (noise), which is generated from a dither generator 14, to the digital signal and superimpose the dither signal thereon, whereby quantizing noise can be whited, and the occurrence of conversion error can be prevented. The output signal from adder 11, will also be referred to hereafter, as the dithered digital signal. As the dither signal which has been added once must be removed again, a subtracter 13 is placed on the step after the D/A converter 12 so that the dither signal generated from the dither generator 14 is converted into an analog signal by another D/A converter 15 and subtracted (remove) by the subtracter 13 in a state of the analog signal. The analog signal $V_t$ from which the dither signal is removed is output through an analog low pass filter 8. The analog low pass filter 8 is provided for cutting off the signal component having oversampling frequency $NF_s$ in a case of N-times oversampling.

Figure 5:
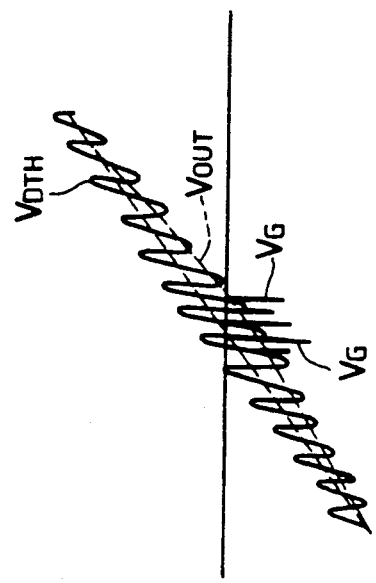
FIG. 5 is an explanatory view of a mechanism of an increase in the occurrence of glitch caused by a dither signal.
Figure 4:
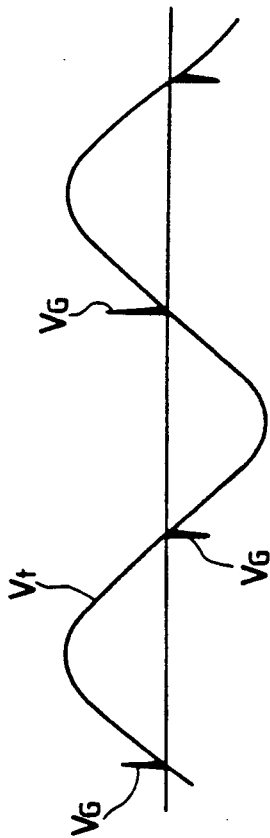
FIG. 4 is an explanatory view of a state wherein glitch occurs.

Although, in a case of 2's complement data, inversion of MSB (Most Significant Bit) is effected at each time the content of the digital data crosses the zero level during D/A conversion, switching noise $V_G$ called glitch is generated during the MSB inversion (refer to FIG. 4). FIG. 5 is an enlarged view of the vicinity of the zero crossing point. As seen from FIG. 5, the glitch $V_G$ is noise naturally generated in the D/A converter 12, and the use of a dither circuit causes a further increase in noise by vibration of a dither signal $V_{DTH}$. This phenomenon is caused by an increase in the number of times of zero crossing in correspondence with vibration of the dither $V_{DTH}$. When the D/A conversion output containing the glitch $V_G$ is introduced into the low pass filter 8, the signal $V_{OUT}$ output from the low pass filter 8 has a waveform which is distorted by the integrating function of the low pass filter 8, as shown by the broken line in FIG. 5. Particularly when the original signal is a low level of signal, this has a significant effect and deceases the fidelity of reproduction.

First Embodiment

Figure 6:
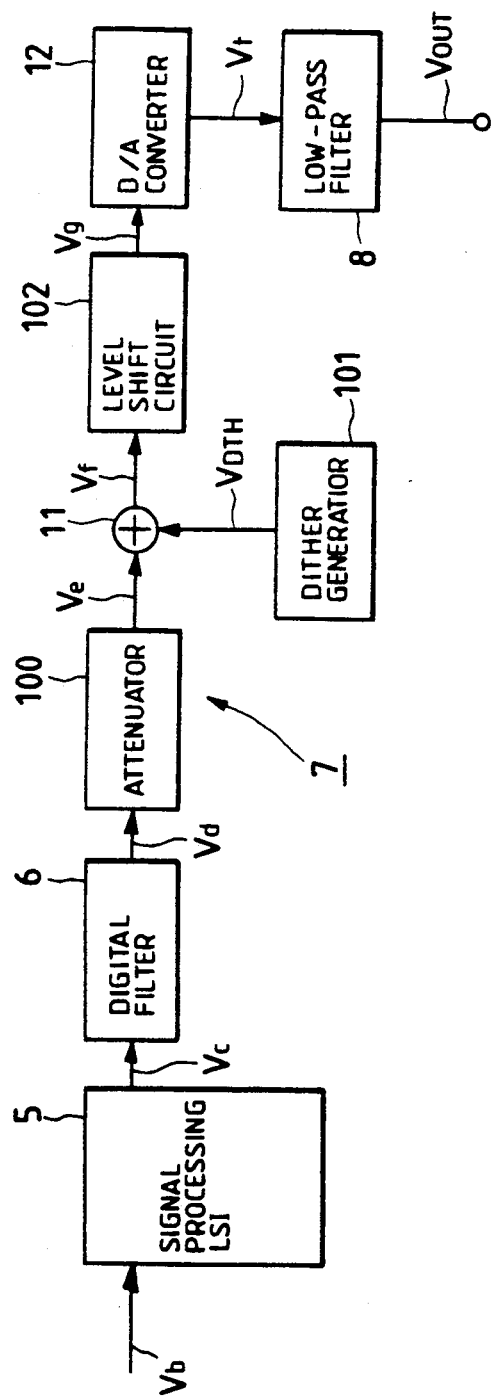
FIG. 6 is an explanatory view of a first embodiment of the present invention.

FIG. 6 shows a first embodiment of the D/A converter in accordance with the present invention in which the above-described disadvantage of conventional converters is improved. A D/A converting device 7 shown in FIG. 6 has a configuration different from that shown in FIG. 3 in the point that an attenuator 100 is interposed between the digital filter 6 and the adder 11, a sine wave dither generator 101 is used as a dither generator, and a level shift circuit 102 is interposed between the adder 11 and the D/A converter 12.

The attenuator 100 outputs an output signal $V_e$ which is generated by reducing the level of the signal $V_d$ input from the digital filter 6 by an amount corresponding to the amplitude level of the sine wave dither signal $V_{DTH}$. When the signal $V_g$ input to the D/A converter 12 is in an overflow level, it is therefore possible to prevent the signal from overflowing by an amount corresponding to the level of the dither signal $V_{DTH}$ and thus prevent the occurrence of waveform distortion caused by the overflow. The attenuator 100 can be formed by, for example, a multiplier for multiplying the digital signal $V_d$ by enumeration data (<1) corresponding to a level to which the level of the signal is attenuated. Such a multiplier is know as a digital attenuator which is capable of adjusting the enumeration data to any desired attenuation level in correspondence with the level of the dither signal $V_{DTH}$.

The dither generator 101 does not generate a random sequence dither signal but generates the dither signal $V_{DTH}$ which is a signal having a waveform expressed by a periodic function such as a sine wave (or a trigonal wave). When an appropriate level of sine wave dither signal $V_{DTH}$ having an appropriate frequency is added, the D/A converter 15 (FIG. 3) for removing the random sequence dither signal after D/A conversion, as in conventional devices, can be made unnecessary. Since the sine wave dither signal $V_{DTH}$ can be completely removed by the low pass filter, the configuration can be simplified, and the characteristics can be improved.

Figure 7:
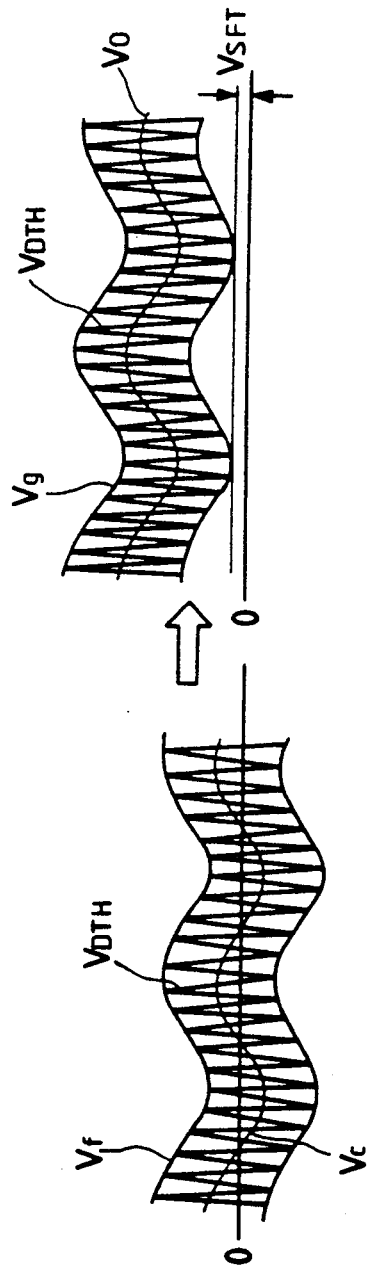
FIG. 7 is an explanatory view of the level shift operation in the first embodiment.

The level shift circuit 102 is a circuit which generates a signal $V_g$ obtained by shifting the addition signal $V_f$ generated by the adder 11 to a positive level on the basis of the zero level by a predetermined shift voltage $V_{SFT}$, as shown in FIG. 7. Specifically, DC bias data are added so that the shift voltage $V_{SFT}$ is set to a value at which the lower limit of the addition signal $V_g$ of the dither signal $V_{DTH}$ and the original signal is not on the zero level. The shift voltage $V_{SFT}$ may be set to an optimum value by taking the level of attenuation by the attenuator 100 into consideration. In this way, the addition signal $V_f$ itself is shifted to the positive side on the basis of the zero level to generate a signal which does not cross the zero level, whereby no MSB inversion is effected in the D/A converter 12 when the attenuation output signal $V_e$ is a low level of signal which is easily affected by switching noise. As a result, no switching noise occurs, and thus the problem with respect to the waveform distortion shown in FIG. 5 is resolved. Although the above description concerns the level shift toward the positive side, the signal may be shifted to the negative side.

The low pass filter 8 is an active filter comprising an operational amplifier, a capacitor and a resistance element. The cut-off frequency of the low pass filter 8 is set to a value higher the frequency band of 0 to 20 kHz required for the orIginal signal. The damping characteristics depend upon the oversampling frequency of the digital filter 6. The higher the oversampling frequency, the more the damping curve can be made gentle. The low pass filter 8 allows only the passing band of 0 to 20 kHz necessary for the analog signal $V_e$ resulted from subtraction to pass therethrough and removes the component higher than the passing band to output an audio reproduction signal $V_{OUT}$. As a result, a folded frequency component is removed from the analog signal $V_t$.

The audio reproduction signal $V_{OUT}$ is amplified by a steroamplifier, converted into an audio signal by a speaker and then reaches the ears of a listener.

A series of operation is summarized below. The digital data $V_b$ read from the CD 1 is filtered by the digital filter 6 through the signal processing LSI 5 to form the signal $V_d$. The signal $V_d$ is damped by the attenuator 100 by a level which prevents overflowing and then sent to the adder 11. In the adder 11, the sine wave dither signal $V_{DTH}$ generated from the dither generator 101 is mixed with the signal $V_e$, and the level of the addition signal $V_f$ is shifted by an appropriate value ($V_{SFT}$) by the level shift circuit 102 to form the signal $V_g$ which is then subjected to D/A conversion into the signal $V_t$ in the D/A converter 12. The higher component (including $V_{DTH}$) is removed from the signal $V_t$ by the low pass filter 8 to obtain a reproduction signal corresponding to the signal recorded in the CD 1.

Second Embodiment

Figure 8:
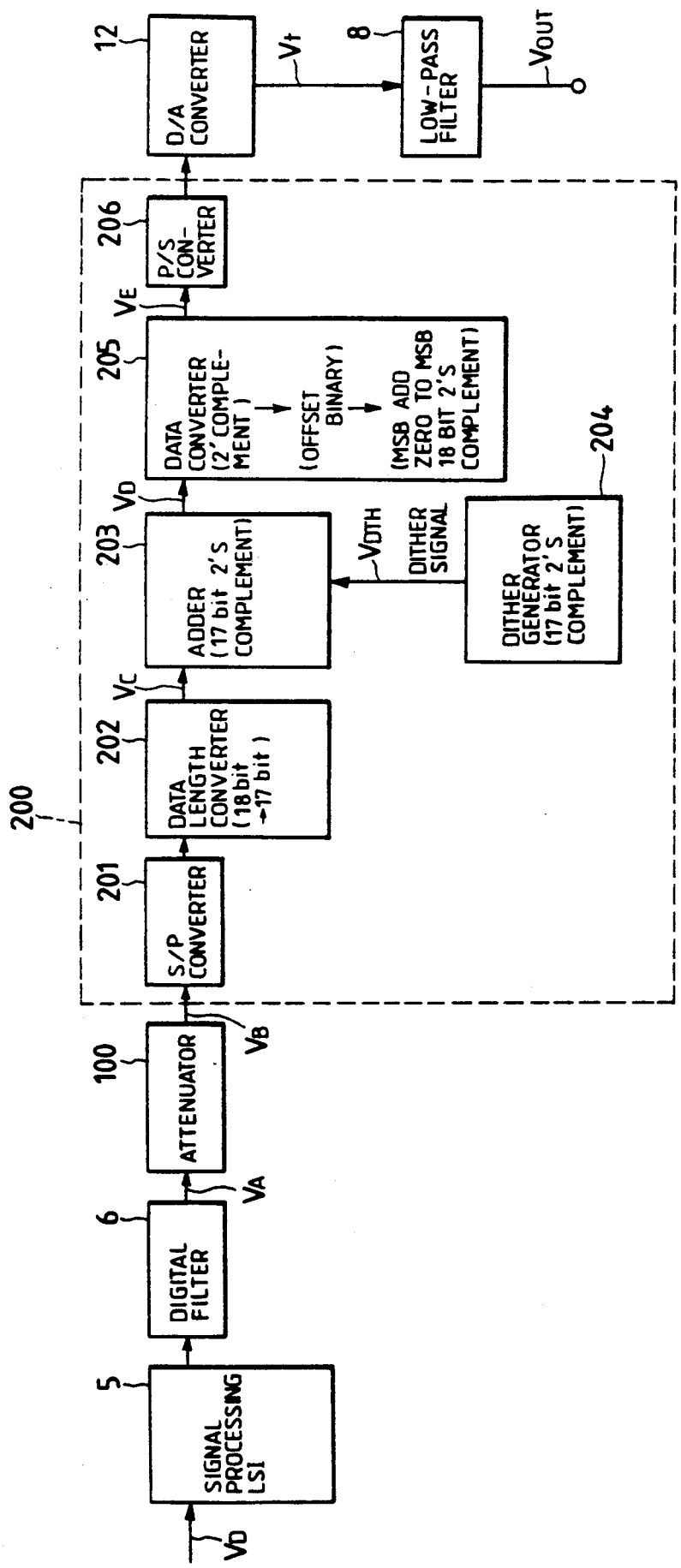
FIG. 8 is an explanatory view of a second embodiment.

FIG. 8 shows a second embodiment of the present invention. In FIG. 8, the same portion as those shown in FIG. 6 are denoted by the same reference numerals.

The input data processor 200 shown in the second embodiment comprises a S/P (Serial to Parallel) converter 201 for converting the data $V_B$ (serial data) output from the attenuator 100 into parallel data, a data length converter 202 for compressing the signal amplitude by converting 18 bit data to 17 bit data, an adder 203 for adding the dither signal $V_{DTH}$ to compressed data $V_c$, a dither generator 204 for supplying the sine wave dither signal $V_{DTH}$ to the adder 203, a data converter 205 for converting 2's complement data output from the adder 203 into offset binary code data, and a P/S converter 206 for converting the parallel data $V_E$ output from the data converter 205 into serial data.

Figure 9A:
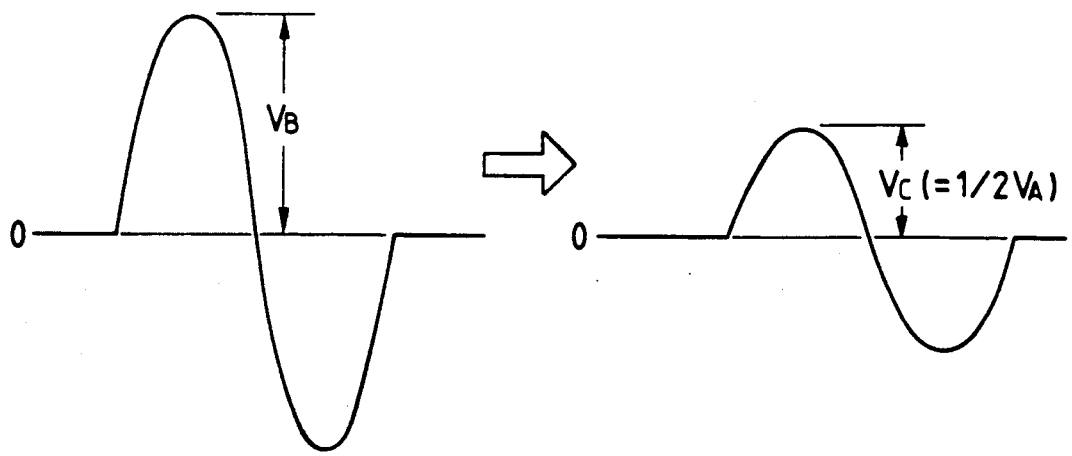
FIG. 9($a$) is an explanatory view of the effect of compressing a data length.
Figure 9B:
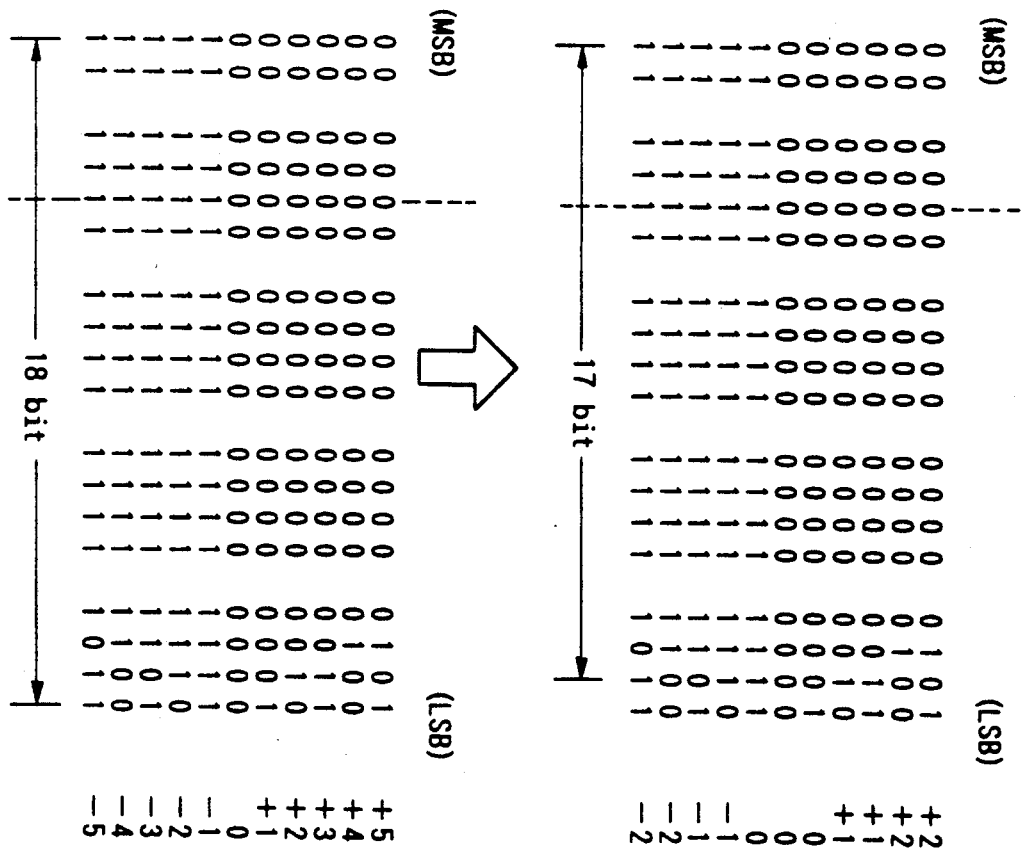

When the output data $V_B$ is 18 bit data, the data length converter 202 cuts off one bit of LSB to output the compressed data $V_c$ of 17 bit. Conversion from 18-bit data to 17-bit data is equivalent to the reduction in the amplitude value of the output data $V_B$ to half, as shown in FIG. 9(b).

The data converter 205 converts the data $V_D$ output from the adder 203 into offset binary data by inverting MSB of the 17-bit 2's complement data of the output data $V_D$. 1-bit "0" data further added as MSB to the 17-bit offset binary data generated by the MSB inversion so as to again convert the data to 2's complement data $V_E$. The addition of "0" data as MSB means that the data is shifted toward the positive side with respect to the 2's complement data.

A series of operations are summarized below.

Figure 10:
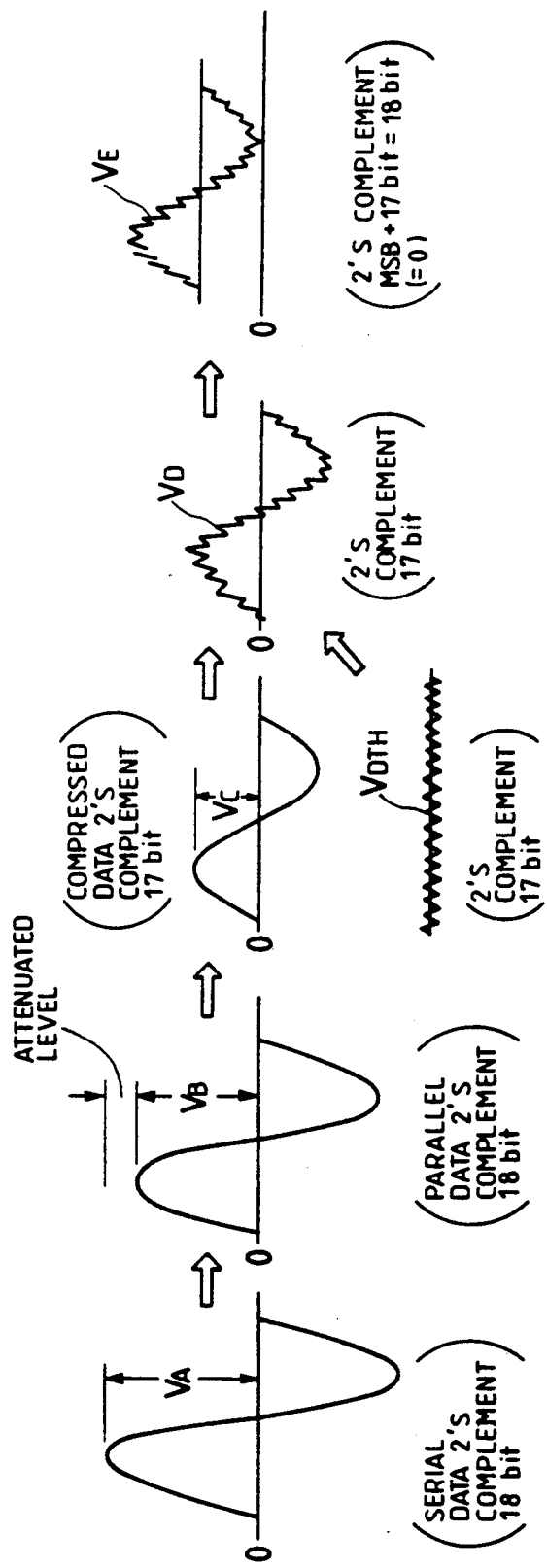
FIG. 10 is an explanatory view of the level shift operation in the second embodiment.

As shown in FIG. 10, the output data $V_B$ generated by attenuation of the signal $V_A$ output from the digital filter 6 is converted into parallel data in the data length converter 201 and input to the data length converter 202. The data length converter 202 compresses data by converting 18-bit data into 17-bit data to obtain the compressed data $V_C$. The dither signal $V_{DTH}$ is added to the compressed data $V_C$ in the adder 203. The output data $V_D$ is then input to the data converter 205 in which the 2's complement data is converted into offset binary data, and "0" is then added as MSB to offset the offset data toward the positive side. Consequently, there is no zero crossing point, and the occurrence of switching noise in the D/A converter 4 is prevented. The output data $V_E$ offset is converted into serial data by the P/S converter 206, converted into an analog signal by the D/A converter 4 and input to the analog low pass filter 6 through which the dither signal $V_{DTH}$ is removed.

What is claimed is:

1. An input data processor for a D/A converter for processing digital data which is input to a D/A converter, said digital data corresponding to an alternating signal of the type which crosses a zero level, said processor comprising:
   a dither signal adder for adding a dither signal to said digital signal, and to provide a dithered digital signal; and
   a level shift circuit for shifting a level of said dithered digital signal, by an amount sufficient to prevent said dithered digital signal from crossing said zero level.

2. An input data processor according to claim 1, further comprising an attenuator for attenuating said digital data input to said dither signal adder at least by the signal level of said dither signal.

3. An input data processor according to claim 1, wherein said dither signal is a signal having an analogue waveform expressed by a periodic function.

4. An input data processor for an D/A converter for processing digital data which is input to a D/A converter, said digital data corresponding to an alternating signal of the type which crosses a zero level, said processor comprising:
   a dither signal adder for adding a dither signal to said digital signal and to provide a dithered digital signal; and
   a data length converter for compressing the data length of said dithered digital signal; and
   a level shift circuit for shifting said compressed dithered digital signal by an amount sufficient to prevent said dithered digital signal from crossing said zero level.

5. An input data processor according to claim 4, further comprising an attenuator for attenuating said digital data input to said dither signal adder at least by the signal level of said dither signal.

* * * * *